US010424568B1

(12) United States Patent
Tan et al.

(10) Patent No.: US 10,424,568 B1
(45) Date of Patent: Sep. 24, 2019

(54) IMAGE SENSOR WITH STACKED SPAD AND METHOD FOR PRODUCING THE SAME

(71) Applicant: GLOBALFOUNDRIES Singapore Pte. Ltd., Singapore (SG)

(72) Inventors: Kian Ming Tan, Singapore (SG); Khee Yong Lim, Singapore (SG); Elgin Kiok Boone Quek, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/012,415

(22) Filed: Jun. 19, 2018

(51) Int. Cl.
  *H01L 25/16* (2006.01)
  *H01L 27/146* (2006.01)
  *H01L 31/107* (2006.01)
  *H01L 31/02* (2006.01)

(52) U.S. Cl.
  CPC ...... *H01L 25/167* (2013.01); *H01L 27/14643* (2013.01); *H01L 27/14649* (2013.01); *H01L 31/02027* (2013.01); *H01L 31/107* (2013.01)

(58) Field of Classification Search
  CPC ................ H01L 25/167; H01L 27/14649
  USPC ...................................... 257/292; 250/208.1
  See application file for complete search history.

(56) References Cited

U.S. PATENT DOCUMENTS

| 8,329,497 | B2 | 12/2012 | Qian et al. |
| 9,608,027 | B2 | 3/2017 | Sun et al. |
| 2009/0200589 | A1* | 8/2009 | Qian ................. H01L 27/14603 257/292 |
| 2011/0317048 | A1 | 12/2011 | Bai et al. |
| 2012/0313204 | A1* | 12/2012 | Haddad ............... H01L 27/1462 257/432 |
| 2015/0035028 | A1* | 2/2015 | Fan .................... H01L 27/14623 257/292 |
| 2017/0053955 | A1* | 2/2017 | Sze ..................... H01L 27/1464 |
| 2017/0179177 | A1* | 6/2017 | Goma ............... H01L 27/14621 |
| 2018/0019268 | A1* | 1/2018 | Zhang ................. H01L 27/1443 |
| 2018/0084238 | A1* | 3/2018 | Chossat .............. H04N 13/207 |

OTHER PUBLICATIONS

Park et al., "A Study of Vertical Thin Poly-Si Channel Transfer Gate Structured CMOS Image Sensors", published in IEEE Device Letters, vol. 38, No. 2, Feb. 2017, pp. 232-235.
Wikipedia, "Color filter array", Last edited Oct. 29, 2017, retrieved on Jun. 19, 2018 from https://en.wikipedia.org/w/index.php?title=Color_filter_array&oldid=807757070, pp. 1-5.
Fujifilm, "CMY—Complementary color filters for image sensor (IS) applications", retrieved on Jun. 19, 2018, from http://www.fujifilmusa.com/products/semiconductor_materials/image-sensor-color-mosaic/cmy/index.html#applications, 2 pages.

(Continued)

*Primary Examiner* — David Vu
*Assistant Examiner* — Brandon C Fox
(74) *Attorney, Agent, or Firm* — Ditthavong & Steiner, P.C.

(57) ABSTRACT

A method of forming a device including a SPAD detector and a BSI visible light sensor positioned on different planes, the device exhibiting improved resolution and pixel density are provided. Embodiments include a photodiode for detecting visible light; and a SPAD detector for detecting IR radiation, wherein the photodiode and the SPAD detector are on different planes.

17 Claims, 10 Drawing Sheets

(56) References Cited

OTHER PUBLICATIONS

Holland et al., "Fully-Depleted, Back-Illuminated Charge-Coupled Devices Fabricated on High-Resistivity Silcon", published in IEEE Transactions on Electron Devices, vol. 50, No. 1, Jan. 2003, 14 pages.

* cited by examiner

IMAGE SENSOR WITH STACKED SPAD AND METHOD FOR PRODUCING THE SAME

TECHNICAL FIELD

The present disclosure relates to image sensors. The present disclosure is particularly applicable to backside illumination (BSI) visible light sensors and single-photon avalanche diode (SPAD) detectors.

BACKGROUND

When BSI visible light sensors and SPAD detectors are fabricated on the same substrate, their detector density is reduced because the substrate area is shared between two different types of detectors. Further, resolution and pixel density for both BSI visible light sensors and SPAD detectors are reduced.

A need therefore exists for an image sensor with improved resolution and pixel density, and for enabling methodology.

SUMMARY

An aspect of the present disclosure is a device including a SPAD detector and a BSI visible light sensor positioned on different planes, the device exhibiting improved resolution and pixel density.

Another aspect of the present disclosure is a method of forming a device including a SPAD detector and a BSI visible light sensor positioned on different planes, the device exhibiting improved resolution and pixel density.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a device including: a photodiode for detecting visible light; and a SPAD detector for detecting infrared (IR) radiation, wherein the photodiode and the SPAD detector are on different planes.

Another aspect of the present disclosure is a method including: forming a BSI visible light sensor with a crystalline vertical transfer gate (VTG) channel in a first tier; forming a SPAD detector in a second tier; and bonding the first tier and the second tier, wherein the crystalline VTG channel transfers a charge from the BSI visible light sensor to a read out circuitry in the second tier.

A further aspect of the present disclosure is device including: a BSI visible light sensor with a crystalline VTG channel in a first tier for detecting visible light; a SPAD detector in a second tier for detecting IR radiation; and the first tier bonded to the second tier, wherein the BSI visible light sensor and the SPAD detector are positioned such that a charge generated in the BSI visible light sensor is transferred by the crystalline VTG channel to a read out circuitry in the second tier.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of reduced resolution and pixel density attendant upon forming the BSI visible light sensors and SPAD detectors on the same substrate. The problem is solved, inter alia, by forming SPAD detector and BSI visible light sensor on different substrate/planes.

Methodology in accordance with embodiments of the present disclosure includes a photodiode for detecting visible light, and a SPAD detector for detecting IR radiation. The photodiode and the SPAD detector are formed on different planes.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
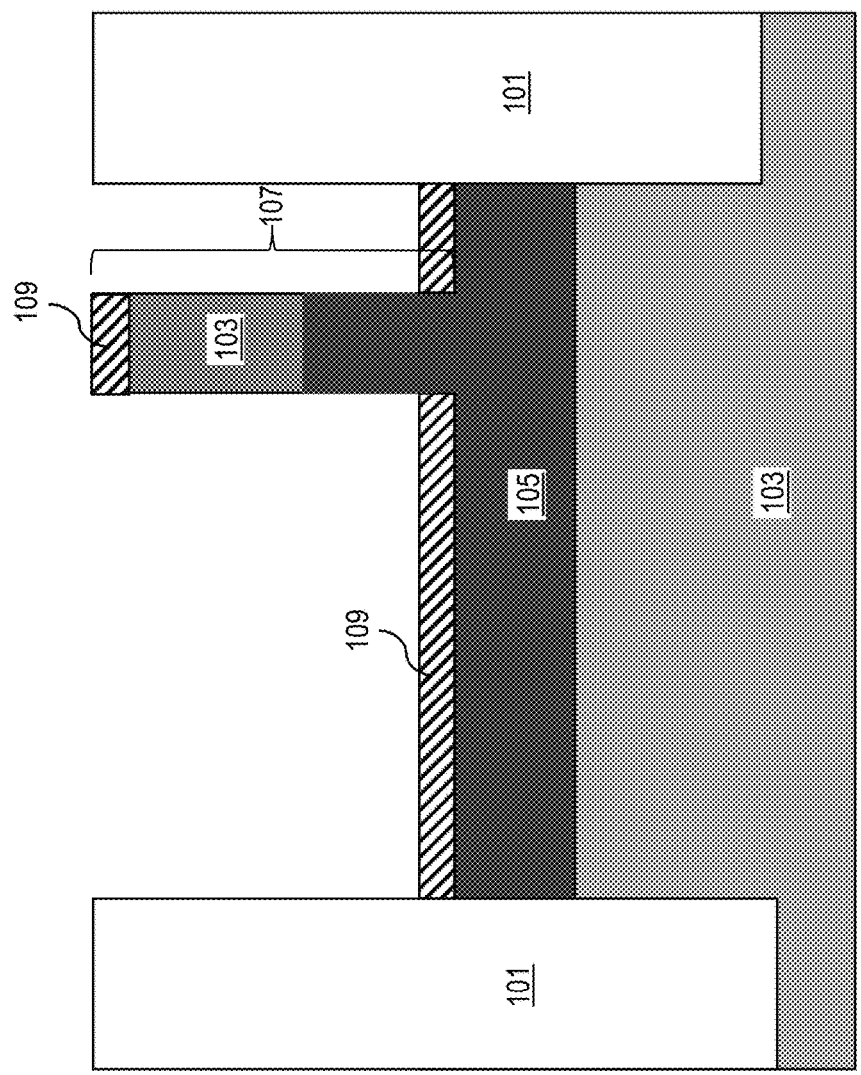
FIGS. 1 through 7 illustrate cross-sectional views of a process flow for forming a BSI visible light sensor with a crystalline VTG channel, in accordance with an exemplary embodiment.

FIGS. 1 through 7 illustrate cross-sectional views of a process flow for forming a BSI visible light sensor with a crystalline VTG channel, in accordance with an exemplary embodiment. Referring to FIG. 1, STI regions 101 are formed in a first tier substrate 103 (herein after substrate 103), e.g., formed of silicon (Si), germanium (Ge), indium gallium arsenide (InGaAs) or any other material with similar functional properties. The STI regions 101 are filled with insulating material, e.g., silicon dioxide (SiO$_2$), silicon nitride (SiN) or any other material with similar functional properties, electrically isolating regions in the substrate 103. Then, an N+ layer 105 is formed, e.g., by N-type dopants phosphorus (P), arsenic (As) or any other material with similar functional properties, within the substrate 103. Thereafter, a portion of the substrate 103 and the N+ layer 105 are etched, forming a fin 107. In one instance, the lower portion of the fin 107 includes N+ layer 105 and the upper portion of the fin 107 includes substrate 103. Subsequently, a P+ layer 109 is formed, e.g., by P-type dopants boron (B), indium (In) or any other material with similar functional properties, in an upper surface of the N+ layer 105 and the fin 107.

Figure 2:
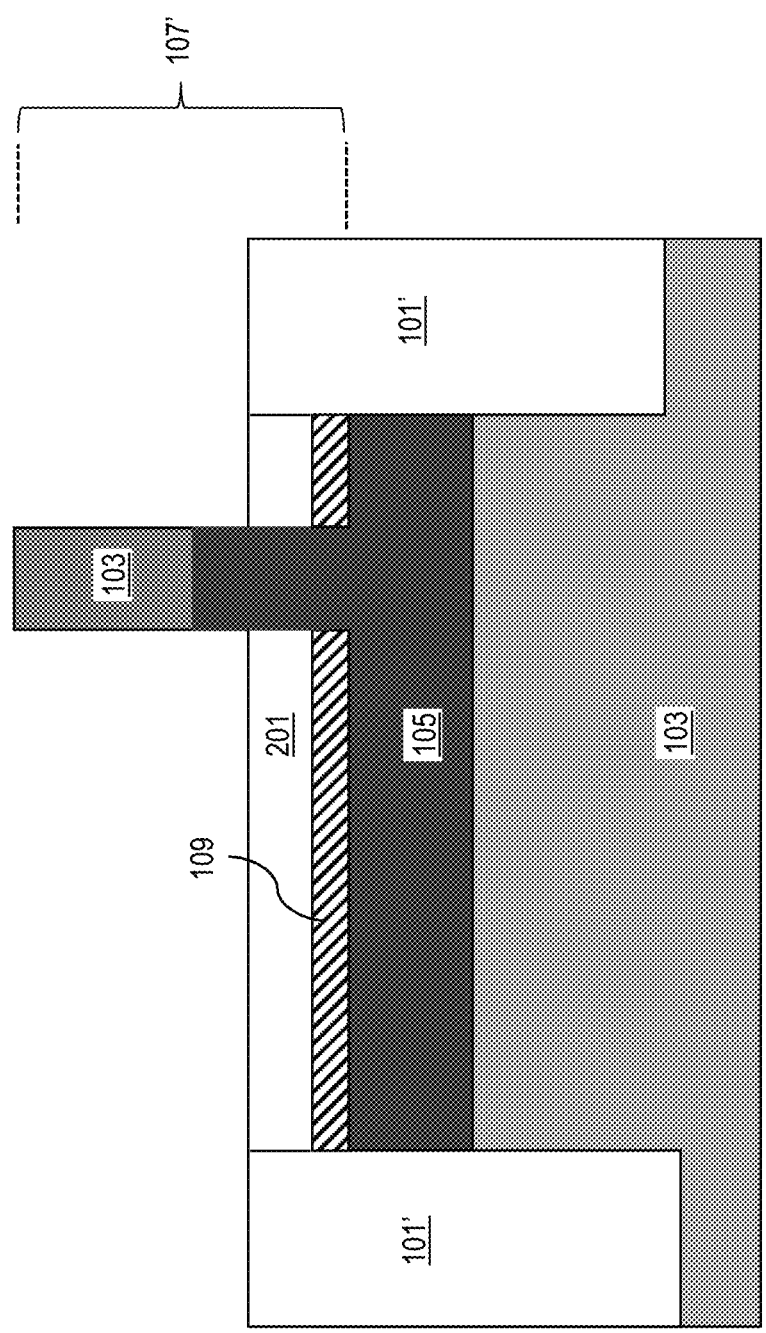
Figure 3:
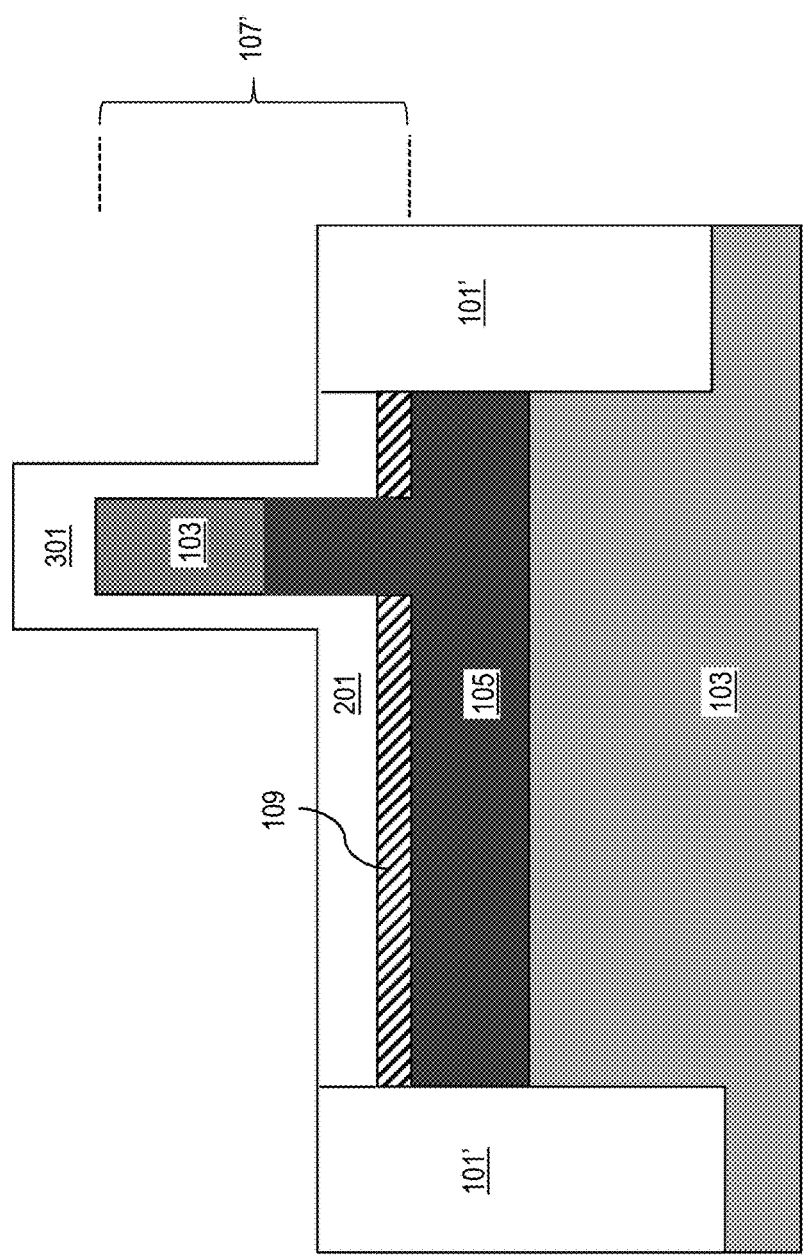

Thereafter, an oxide layer is formed over the P+ layer 109 and the fin 107 between the STI regions 101. Then, the oxide layer and the P+ layer 109 in an upper surface of the fin 107 are planarized, e.g., by chemical mechanical planarization (CMP) or like processes, forming fin 107', as represented in FIG. 2. In this instance, the upper surface of the oxide layer is substantially coplanar to the upper surface of the fin 107' (not shown for illustrative convenience). Next, a portion of the oxide layer and the STI regions 101 are etched below the lower portion of the fin 107', forming STI regions 101' and oxide layer 201. As depicted in FIG. 3, a gate dielectric layer 301 is formed, e.g., of silicon oxide, silicon nitride (Si$_3$N$_4$), hafnium oxide (HfO$_2$) or any other material with similar functional properties, over and along the fin 107' and portions of the oxide layer 201. In one instance, the surface of the fin 107' is treated for roughness prior to forming the gate dielectric layer 301.

Figure 4:
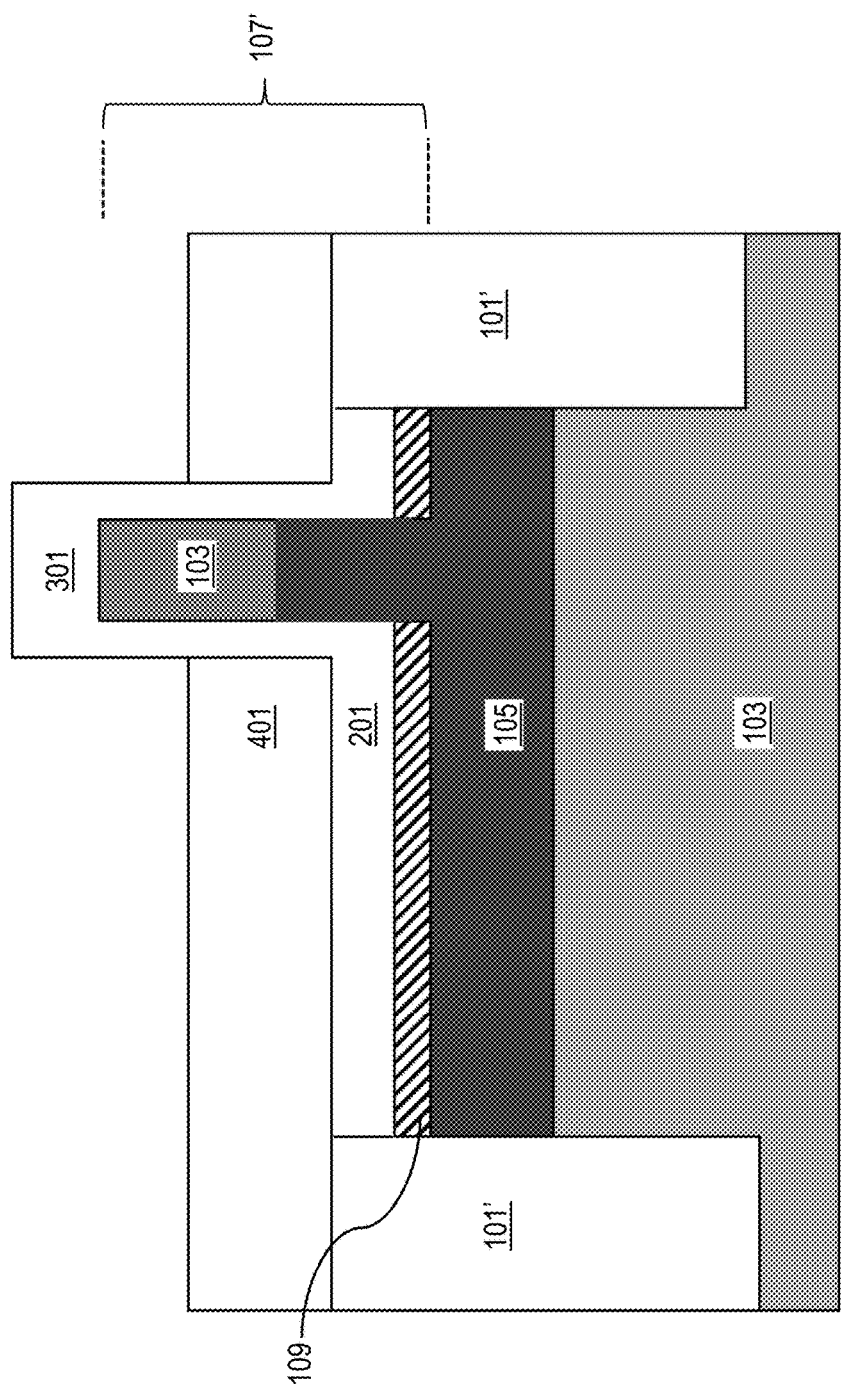
Figure 5:
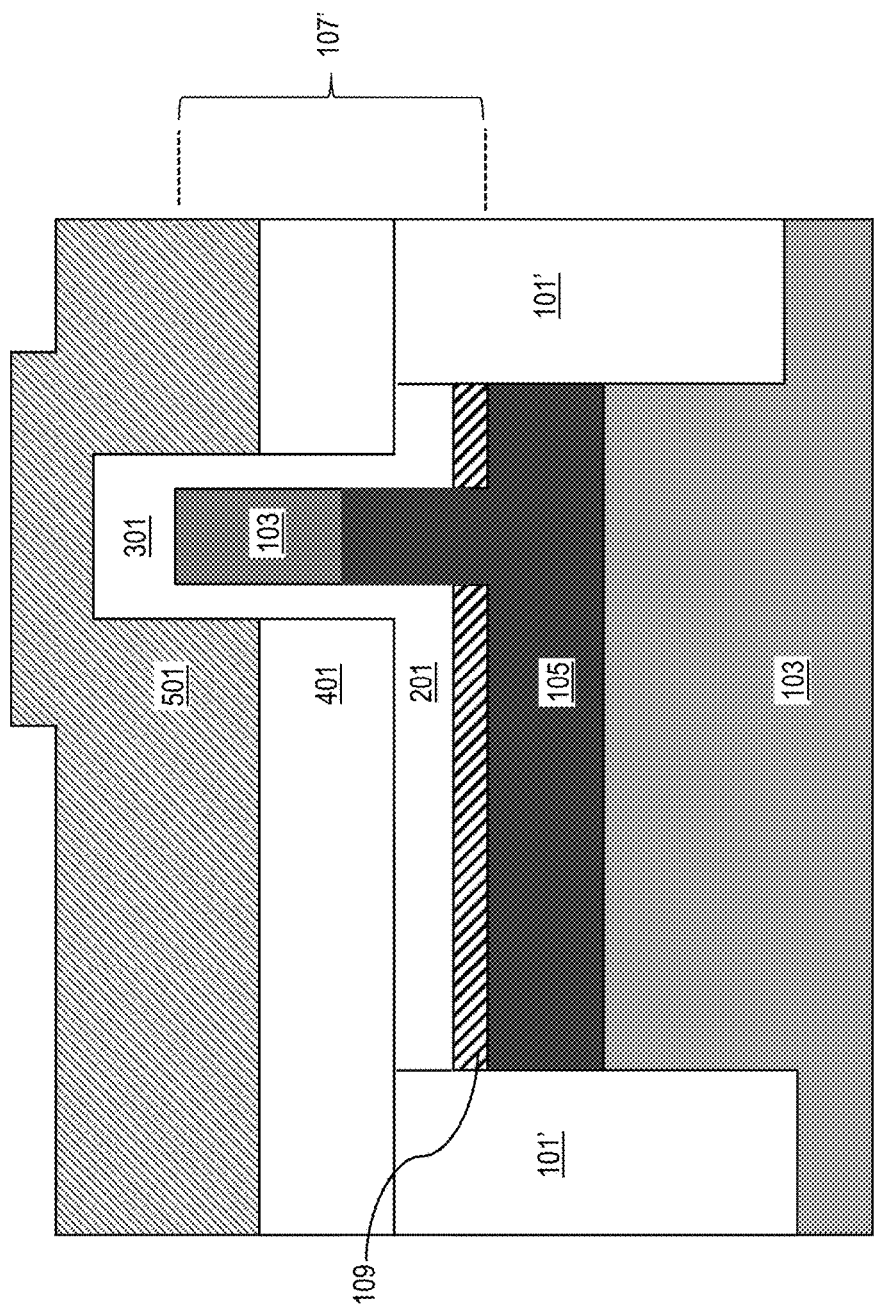
Figure 6:
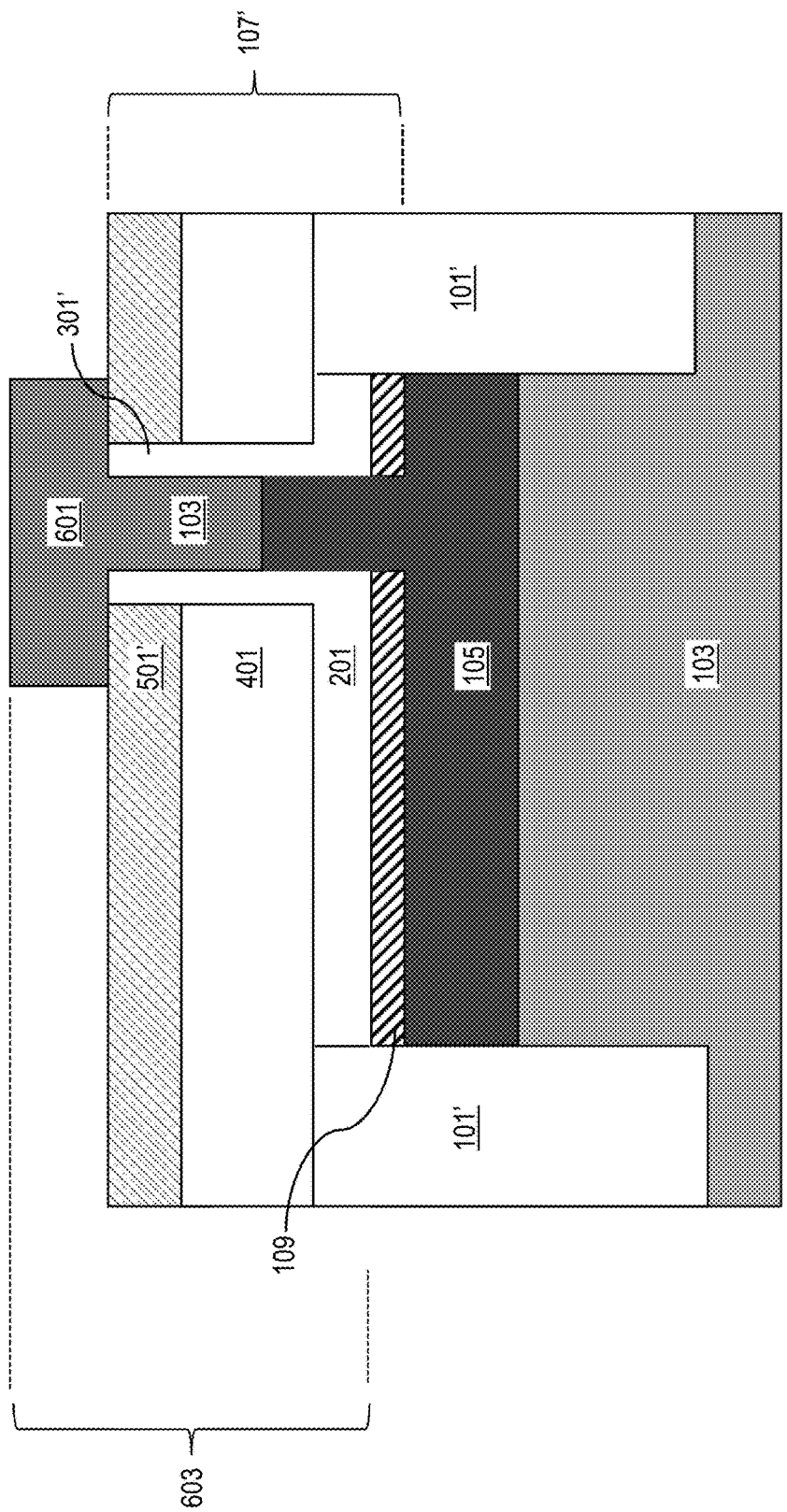

Referring to FIG. 4, a gate layer is formed, e.g., of polycrystalline silicon, titanium (Ti), tantalum nitride (TaN), indium oxide (In$_2$O$_3$) or any other material with similar functional properties, over the STI regions 101', the oxide layer 201 and the gate dielectric layer 301. Next, the gate layer is etched, e.g., by dry etching or a combination of CMP and dry etching, below an upper surface of the fin 107', forming the gate layer 401. Thereafter, the gate layer 401 is patterned (not shown for illustrative convenience). In one instance, the gate layer 401 may include a non-transparent gate material that is etched and patterned to minimize the coverage on top of the P+ layer 109, i.e., a visible light sensor. Then, a dielectric layer 501 is formed, e.g., of nitride, oxide or any other material with similar functional properties, over the gate layer 401 and gate dielectric layer 301, as depicted in FIG. 5. Then, the dielectric layer 501 and the gate dielectric layer 301 are planarized, e.g., by CMP or like processes, down to the upper surface of the fin 107', forming gate dielectric layer 301' and gate dielectric layer 501', as illustrated in FIG. 6. Subsequently, a Si floating node (FN) layer 601 is formed, e.g., by epitaxy or polysilicon deposition, over the fin 107', the gate dielectric layer 301' and portions of the dielectric layer 501'. Subsequently, the Si FN layer 601 is doped with N-type dopants. In one instance, the Si FN layer 601 and the fin 107' forms a T-shaped crystalline VTG channel 603.

Figure 7:
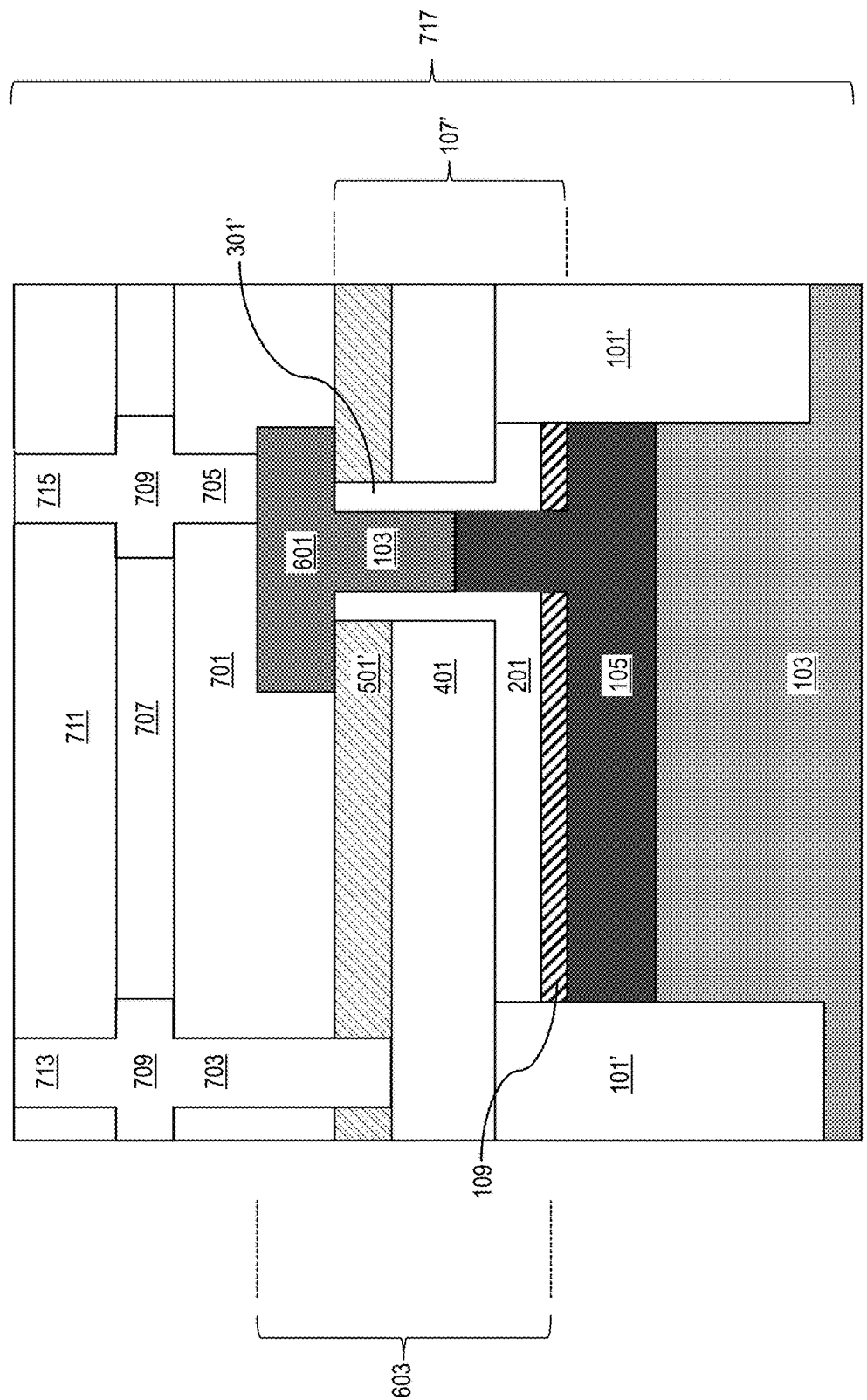

Next, in FIG. 7, an oxide layer 701 is formed over the gate dielectric layer 501' and the Si FN layer 601. Thereafter, contact 703 is formed through the oxide layer 701 and the dielectric layer 501' to the gate layer 401; and contact 705 is formed through the oxide layer 701 to the Si FN layer 601. In one instance, the contacts 703 and 705 are filled with tungsten (W), copper (Cu) or any other material with similar functional properties. Then, an oxide layer 707 is conformally deposited over the oxide layer 701. Thereafter, a metal layer 709 is formed in the oxide layer 707 and above the contacts 703 and 705. Next, an oxide layer 711 is formed over the oxide layer 707 and the metal layer 709. Subsequently, vias 713 and 715 are formed through the oxide layer 711 to the metal layer 709. This process can be repeated to form the necessary back end of line (BEOL) process as required. Accordingly, a BSI visible light sensor 717 is formed in a first tier.

Figure 8:
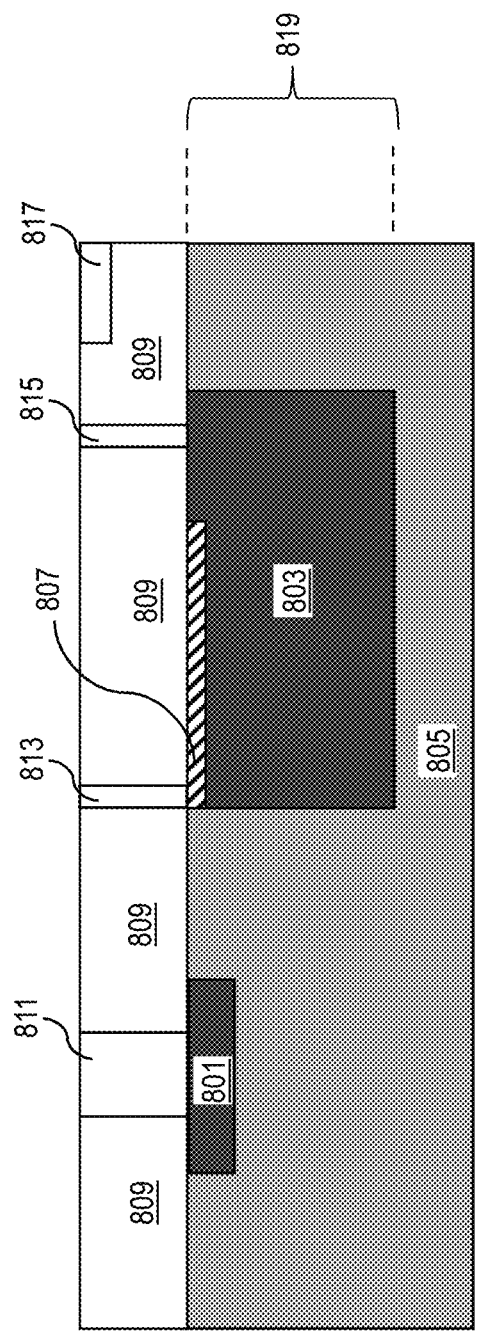
FIG. 8 illustrates a cross-sectional view of a SPAD detector and a portion of read out circuitry for BSI visible light sensors, in accordance with an exemplary embodiment.

FIG. 8 illustrates a cross-sectional view of a SPAD detector and a portion of read out signal structure for the BSI visible light sensors, in accordance with an exemplary embodiment. Referring to FIG. 8, an N+ region 801, and 803 are formed, e.g., by N-type dopants P, As or any other material with similar functional properties, in a second tier substrate 805 (herein after substrate 805), e.g., formed of Si, Ge, InGaAs or any other material with similar functional properties. Next, a P+ layer 807 is formed, e.g., by P-type dopants B or In, in an upper surface of the N+ region 803. Thereafter, an oxide layer 809 is formed over the substrate 805, the N+ region 801, the P+ layer 807 and the N+ region 803. Subsequently, contacts 811, 813 and 815 are formed, e.g., with similar process as contacts 703 and 705, through the oxide layer 809 down to the N+ region 801, the P+ layer 807 and the N+ region 803, respectively. Similarly, a substrate contact is formed (not shown for illustrative convenience). Consequently, a metal layer 817 is formed, e.g., of Cu, Al or any other material with similar functional properties, in the oxide layer 809. In one instance, multiple levels of oxide, vias and metal layers can be repeatedly formed depending on BEOL requirement. Accordingly, a SPAD detector 819 is formed in a second tier. In one instance, the SPAD detector 819 is surrounded by other SPAD detectors (not shown for illustrative convenience). In another instance, the SPAD detector 819 includes an application specific integrated circuit (ASIC) layer for a two-dimensional (2D) or three-dimensional (3D) data readout. In a further instance, the ASIC layer may be fabricated on a separate third tier substrate to which the substrate 103 and 805 may be bonded.

Figure 9:
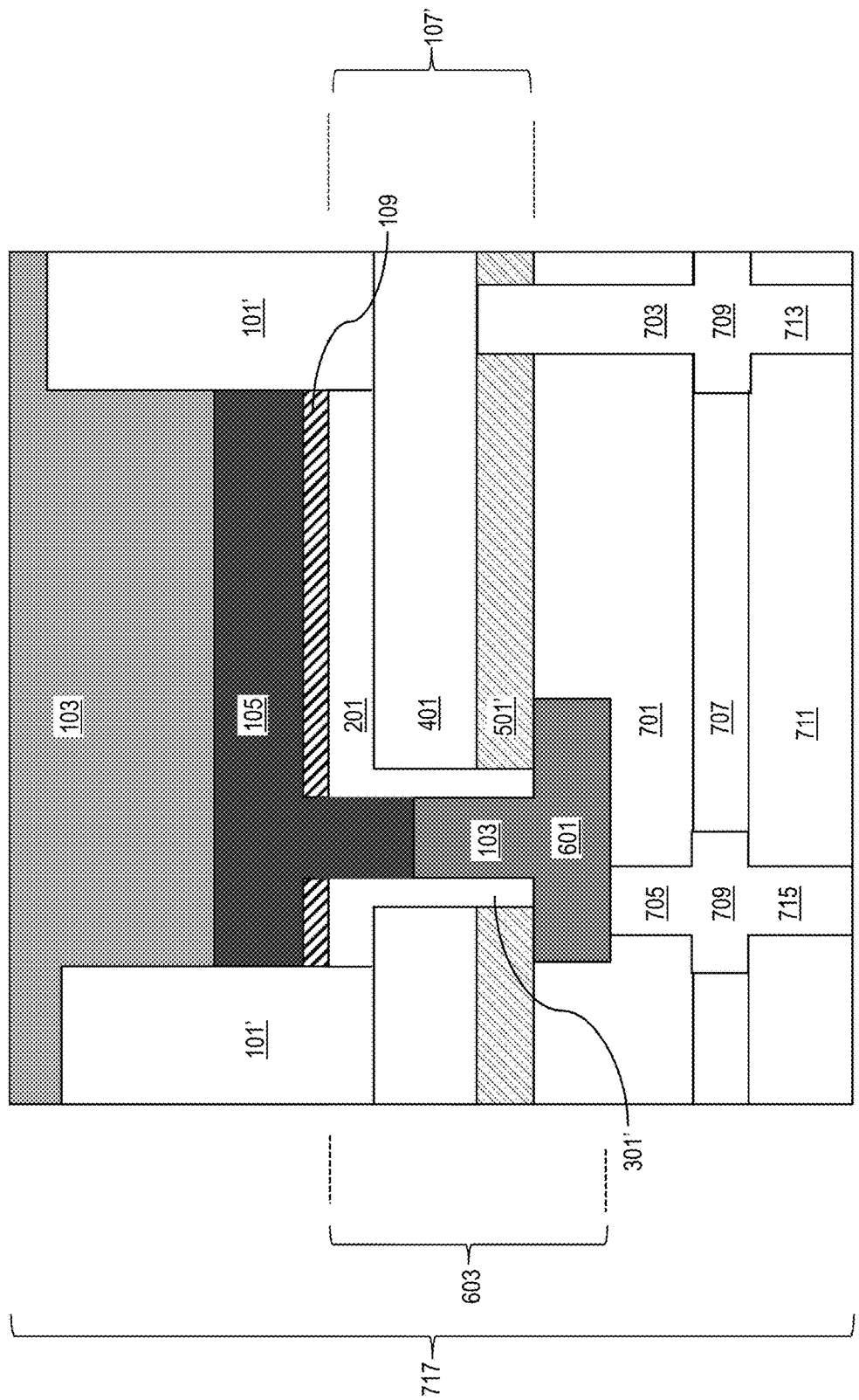
FIGS. 9 and 10 illustrate cross-sectional views of a process flow for bonding the BSI visible light sensor to the SPAD detector, in accordance with an exemplary embodiment.
Figure 10:
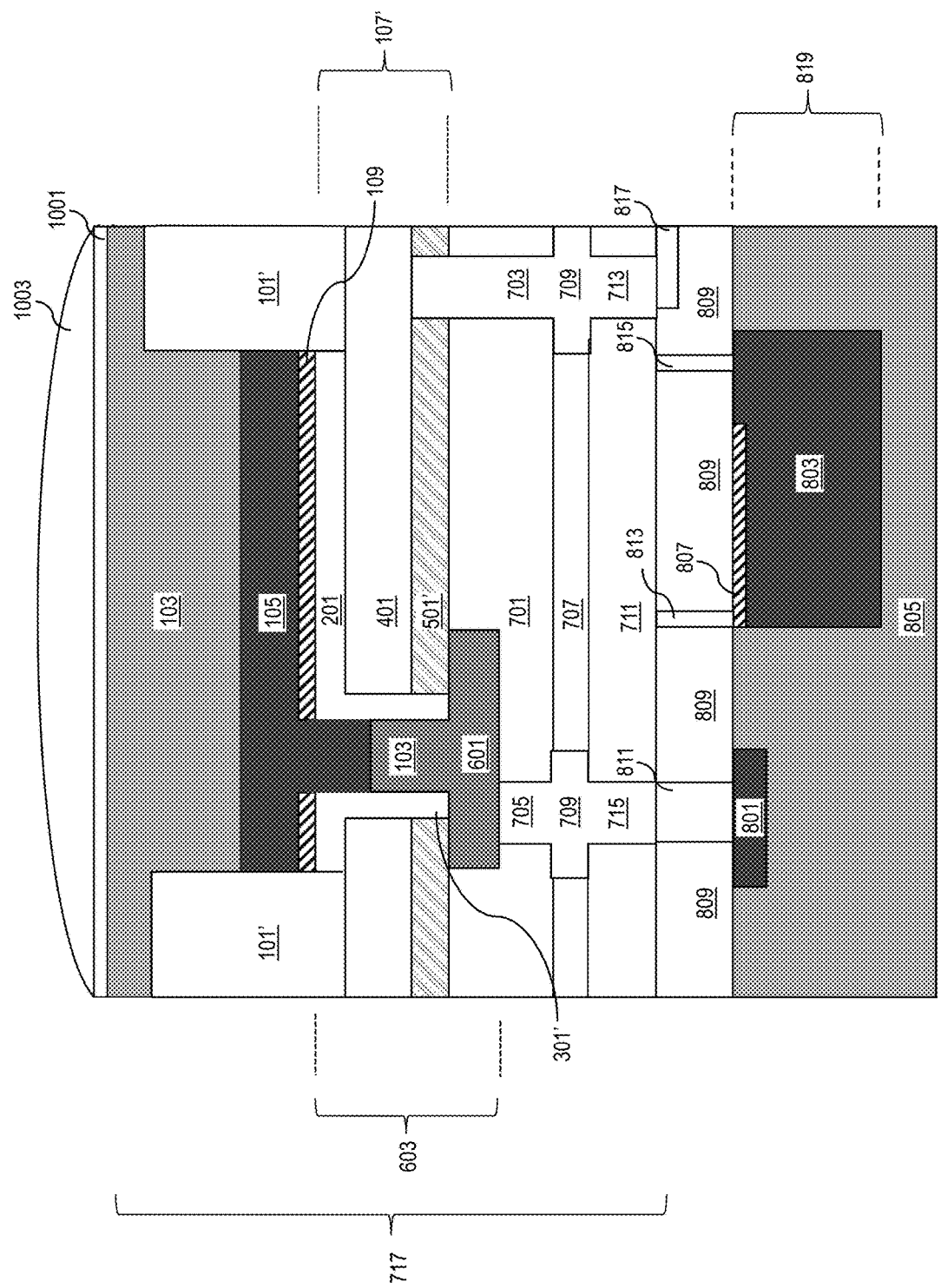

FIGS. 9 and 10 illustrate cross-sectional views of a process flow for bonding the BSI visible light sensor to the SPAD detector, in accordance with an exemplary embodiment. The BSI visible light sensor 717 is flipped as shown in FIG. 9, thereafter, in FIG. 10, the FN contact 705 and the gate contact 703 of the BSI visible light sensor 717 is aligned with contact 811 and metal layer 817 in the same tier as the SPAD detector 819, respectively. The subsequent metal connection to contacts 813 and 815 is not shown for illustrative convenience. The oxide layer 711 of the BSI visible light sensor 717 is bonded, e.g., by through silicon via (TSV), Cu—Cu bonding or like processes, with the oxide layer 809 of the SPAD detector 819. Then, bottom portion of substrate 103 is planarized and thinned, e.g., by backside CMP or like processes, and is followed by a backside treatment. Subsequently, a filter 1001, e.g., color filters, is attached over the bottom surface of the substrate 103 to improve the sensitivity of the BSI visible light sensor 717. In addition, micro-lense 1003 may be attached to the filter 1001 per requirement. In one instance, the crystalline VTG channel 603 transfers a charge from the BSI visible light sensor 717 to the read out circuit (not shown for illustrative convenience) via the N+ region 801, fabricated in the second tier. In another instance, the IR sensing by SPAD detector 819 is used for depth sensing to produce a 3D image. In a further instance, a light first passes through the BSI visible light sensor 717 and then the SPAD detector 819. The SPAD detector 819 allows passage of a specified wavelength or a wavelength more than 850 nanometer (nm).

The embodiments of the present disclosure can achieve several technical effects, such as improved resolution and pixel density because BSI visible light sensors and SPAD detectors are formed on separate tiers or planes. Further, the present disclosure achieves higher fill factor and mobility because the VTG includes a crystalline channel. In addition, performance for each detector can be optimized separately based on the target wavelength or absorption depth. For example, the SPAD detector can utilize a much deeper silicon depth which is beneficial for IR detection. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of integrated semiconductor devices or image sensors.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A sensing detector comprising:
   a photodiode for detecting visible light; and
   a single-photon avalanche diode (SPAD) detector for detecting infrared (IR) radiation, wherein the SPAD detector comprises:
      an N+ region in a second tier substrate;
      a P+ layer in a portion of the N+ region;
      an oxide layer over the second tier substrate; and
      contacts through the oxide layer to the P+ layer, the N+ region, and the second tier substrate,
   wherein the photodiode and the SPAD detector are on different planes.

2. The device according to claim 1, wherein the photodiode and the SPAD detector are positioned such that a charge generated in the photodiode is transferred to the plane in which the SPAD detector is positioned.

3. The device according to claim 1, wherein the photodiode is a backside illumination (BSI) visible light sensor with a crystalline vertical transfer gate (VTG) channel.

4. The device according to claim 3, wherein a first portion of the BSI visible light sensor comprises:
   shallow trench isolation (STI) regions, laterally separated, in a first tier substrate;
   an N-type (N+) layer within the first tier substrate;
   a fin between the STI regions with a lower portion comprising the N+ layer and an upper portion comprising the first tier substrate;
   a P+ layer in an upper surface of the N+ layer; and
   an oxide layer over the P+ layer between the STI regions and below the lower portion of the fin.

5. The device according to claim 4, wherein a second portion of the BSI visible light sensor comprises:
   a gate dielectric layer along sidewalls of the fin and portions of the oxide layer;
   a gate layer over the STI region and the oxide layer and below an upper surface of the fin;
   a dielectric layer over the gate layer, upper surface of the dielectric layer substantially coplanar to the upper surface of the fin; and
   a Si layer over the fin, the gate dielectric layer and portions of the dielectric layer,
   wherein the crystalline VTG channel comprises the Si layer and the fin.

6. The device according to claim 5, wherein a third portion of the BSI visible light sensor comprises:
   a first oxide layer over the dielectric layer and the Si layer;
   a gate contact through the first oxide layer and the dielectric layer to the gate layer;
   a floating node (FN) contact through the first oxide layer to the Si layer;
   a second oxide layer over the first oxide layer;
   a metal layer formed in a portion of the second oxide layer and over the gate contact and the FN contact;
   a third oxide layer over the second oxide layer and the metal layer; and
   a first via and a second via through the third oxide layer to the metal layer.

7. The device according to claim 6, wherein a fourth portion of the BSI visible light sensor comprises:
   an N+ region in a second tier substrate;
   an oxide layer over the second tier substrate;
   a first contact through the oxide layer to the N+ region; and
   a metal layer in a portion of the oxide layer.

8. The device according to claim 7, further comprising:
   an application specific integrated circuit (ASIC) in the second tier substrate with the SPAD detector or in a separate third tier substrate.

9. The device according to claim 1, further comprising:
   top surface of the first tier substrate comprising the photodiode bonded to top surface of the second tier substrate comprising the SPAD detector; and
   a filter over bottom surface of the first tier substrate.

10. A method comprising:
    forming a backside illumination (BSI) visible light sensor with a crystalline vertical transfer gate (VTG) channel in a first tier;
    forming a single-photon avalanche diode (SPAD) detector in a second tier, wherein forming the SPAD detector comprises:
       forming an N+ region in a second tier substrate;
       forming a P+ layer in a portion of the N+ region;
       forming an oxide layer over the second tier substrate; and
       forming contacts through the oxide layer to the P+ layer, the N+ region and the second tier substrate; and
    bonding the first tier and the second tier,
    wherein the crystalline VTG channel transfers a charge from the BSI visible light sensor to a read out circuit in the second tier.

11. The method according to claim 10, comprising forming a first portion of the BSI visible light sensor by:
    forming shallow trench isolation (STI) regions, laterally separated, in a first tier substrate;
    forming a N-type (N+) layer within the first tier substrate;
    forming a fin between the STI regions with a lower portion comprising the N+ layer and an upper portion comprising the first tier substrate;
    forming a P+ layer in an upper surface of the N+ layer and the fin;
    forming an oxide layer over the first tier substrate between the STI regions;

planarizing the oxide layer and the P+ layer in the fin to an upper portion of the fin; and etching the STI regions and the oxide layer below the lower portion of the fin.

12. The method according to claim 11, comprising forming a second portion of the BSI visible light sensor by:
   forming a gate dielectric layer over and along the fin;
   forming a gate layer over the first tier substrate;
   etching the gate layer below an upper surface of the fin;
   forming a dielectric layer over the first tier substrate;
   planarizing the dielectric layer and the gate dielectric layer to the upper surface of the fin; and
   forming a Si layer over the fin, the gate dielectric layer and the dielectric layer,
   wherein the crystalline VTG channel comprises the Si layer and the fin.

13. The method according to claim 12, comprising forming a third portion of the BSI visible light sensor by:
   forming a first oxide layer over the first tier substrate;
   forming a gate contact through the first oxide layer and dielectric layer to the gate layer;
   forming a floating node (FN) contact through the first oxide layer to the Si layer;
   forming a second oxide layer over the first oxide layer;
   forming a metal layer in a portion of the second oxide layer and over the gate contact and the FN contact;
   forming a third oxide layer over the second oxide layer and the metal layer; and
   forming a first via and a second via through the third oxide layer, connecting to the metal layer.

14. The method according to claim 13, comprising forming a fourth portion of the BSI visible light sensor by:
   forming an N+ region in a second tier substrate;
   forming an oxide layer over the second tier substrate;
   forming a first contact through the oxide layer to the N+ region; and
   forming a metal layer in the oxide layer.

15. The method according to claim 10, further comprising bonding the first tier and the second tier by:
   flipping the first tier substrate;
   aligning the FN contact with the first contact in the second tier and the gate contact with the metal layer in the second tier; and
   bonding the third oxide layer with the oxide layer.

16. A device comprising:
   a backside illumination (BSI) visible light sensor with a crystalline vertical transfer gate (VTG) channel in a first tier for detecting visible light, wherein a first portion of the BSI visible light sensor comprises:
      shallow trench isolation (STI) regions, laterally separated, in a first tier substrate;
      an N-type (N+) layer within the first tier substrate;
      a fin between the STI regions with a lower portion comprising the N+ layer and an upper portion comprising the first tier substrate;
      a P+ layer in an upper surface of the N+ layer; and
      an oxide layer over the P+ layer between the STI regions and below the lower portion of the fin;
   a single-photon avalanche diode (SPAD) detector in a second tier for detecting infrared (IR) radiation; and
   the first tier bonded to the second tier,
   wherein the BSI visible light sensor and the SPAD detector are positioned such that a charge generated in the BSI visible light sensor is transferred by the crystalline VTG channel to a read out circuitry in the second tier.

17. The device according to claim 16, wherein a second portion of the BSI visible light sensor comprises:
   a gate dielectric layer along sidewalls of the fin and portions of the oxide layer;
   a gate layer over the STI region and the oxide layer and below an upper surface of the fin;
   a dielectric layer over the gate layer, upper surface of the dielectric layer substantially coplanar to the upper surface of the fin; and
   a Si layer over the fin, the gate dielectric layer and portions of the dielectric layer,
   wherein the crystalline VTG channel comprises the Si layer and the fin.

* * * * *